(12) United States Patent
Dumpit et al.

(10) Patent No.: US 9,730,312 B2
(45) Date of Patent: Aug. 8, 2017

(54) TRANSMISSION LINE STRUCTURE AND METHOD OF ATTACHING TRANSMISSION LINE STRUCTURE TO CONDUCTIVE BODY

(71) Applicant: Nokia Corporation, Espoo (FI)

(72) Inventors: Romeo Dumpit, San Diego, CA (US); Rolf G. Laido, Poway, CA (US); Mikko J. Timperi, Raisio (FI); Vincent Phan, San Diego, CA (US); Toni Kyroenlampi, Escondido, CA (US); Jani Haapamaki, San Diego, CA (US); Tim McGaffigan, Escondido, CA (US)

(73) Assignee: Nokia Technologies Oy, Espoo (FI)

( * ) Notice: Subject to any disclaimer, the term of this patent is extended or adjusted under 35 U.S.C. 154(b) by 126 days.

(21) Appl. No.: 14/497,705

(22) Filed: Sep. 26, 2014

(65) Prior Publication Data

US 2015/0092364 A1      Apr. 2, 2015

Related U.S. Application Data

(60) Provisional application No. 61/883,567, filed on Sep. 27, 2013.

(51) Int. Cl.
| | |
|---|---|
| H05K 1/00 | (2006.01) |
| H05K 1/02 | (2006.01) |
| H05K 3/30 | (2006.01) |
| H05K 7/14 | (2006.01) |

(52) U.S. Cl.
CPC ........... *H05K 1/0215* (2013.01); *H05K 1/028* (2013.01); *H05K 3/30* (2013.01); *H05K 7/14* (2013.01); *H05K 1/0237* (2013.01); *H05K 2201/0999* (2013.01); *H05K 2201/10386* (2013.01); *Y10T 29/49149* (2015.01); *Y10T 29/53174* (2015.01)

(58) Field of Classification Search
USPC .................................................. 361/749, 748
See application file for complete search history.

(56) References Cited

U.S. PATENT DOCUMENTS

| 7,146,017 | B2 | 12/2006 | Steere et al. ................... 381/176 |
|---|---|---|---|
| 7,876,274 | B2 | 1/2011 | Hobson et al. ............... 343/702 |
| 2008/0174983 | A1* | 7/2008 | Kitamura ................ H01L 23/04 |
| | | | 361/816 |
| 2008/0316116 | A1 | 12/2008 | Hobson et al. ............... 343/702 |
| 2008/0316121 | A1* | 12/2008 | Hobson .................. H01Q 1/243 |
| | | | 343/702 |

(Continued)

FOREIGN PATENT DOCUMENTS

| CN | 102800931 A | 11/2012 |
|---|---|---|
| EP | 0 969 547 A2 | 1/2000 |

(Continued)

*Primary Examiner* — Andargie M Aychillhum
(74) *Attorney, Agent, or Firm* — Harrington & Smith

(57) ABSTRACT

A method comprises mounting a grounding clip to a planar flexible printed circuit transmission line; clamping the grounding clip to an inner wall of a chassis of an electronic device; and operating a laser beam to weld the grounding clip to the chassis to route the flexible printed circuit transmission line along the inner wall. Welding the grounding clip to the chassis causes the grounding clip to remain in contact with the planar flexible printed circuit transmission line to ground the planar flexible printed circuit transmission line to the chassis.

11 Claims, 10 Drawing Sheets

(56) References Cited

U.S. PATENT DOCUMENTS

| | | | |
|---|---|---|---|
| 2009/0174612 A1 | 7/2009 | Ayala et al. | 343/702 |
| 2010/0225424 A1 | 9/2010 | Yeates | 333/238 |
| 2011/0180435 A1 | 7/2011 | Jin et al. | 206/320 |
| 2011/0316751 A1 | 12/2011 | Jarvis et al. | 343/702 |
| 2012/0050114 A1 | 3/2012 | Li et al. | |
| 2012/0176278 A1 | 7/2012 | Merz et al. | 343/702 |
| 2012/0176279 A1 | 7/2012 | Merz et al. | 343/702 |
| 2012/0176754 A1 | 7/2012 | Merz et al. | 361/751 |
| 2012/0206302 A1 | 8/2012 | Ramachandran et al. | 343/702 |

FOREIGN PATENT DOCUMENTS

| | | |
|---|---|---|
| KR | 20100092684 A | 8/2010 |
| WO | WO-2009/126480 A2 | 10/2009 |
| WO | WO-2012/107835 A2 | 8/2012 |
| WO | WO-2013/103564 A1 | 7/2013 |

* cited by examiner

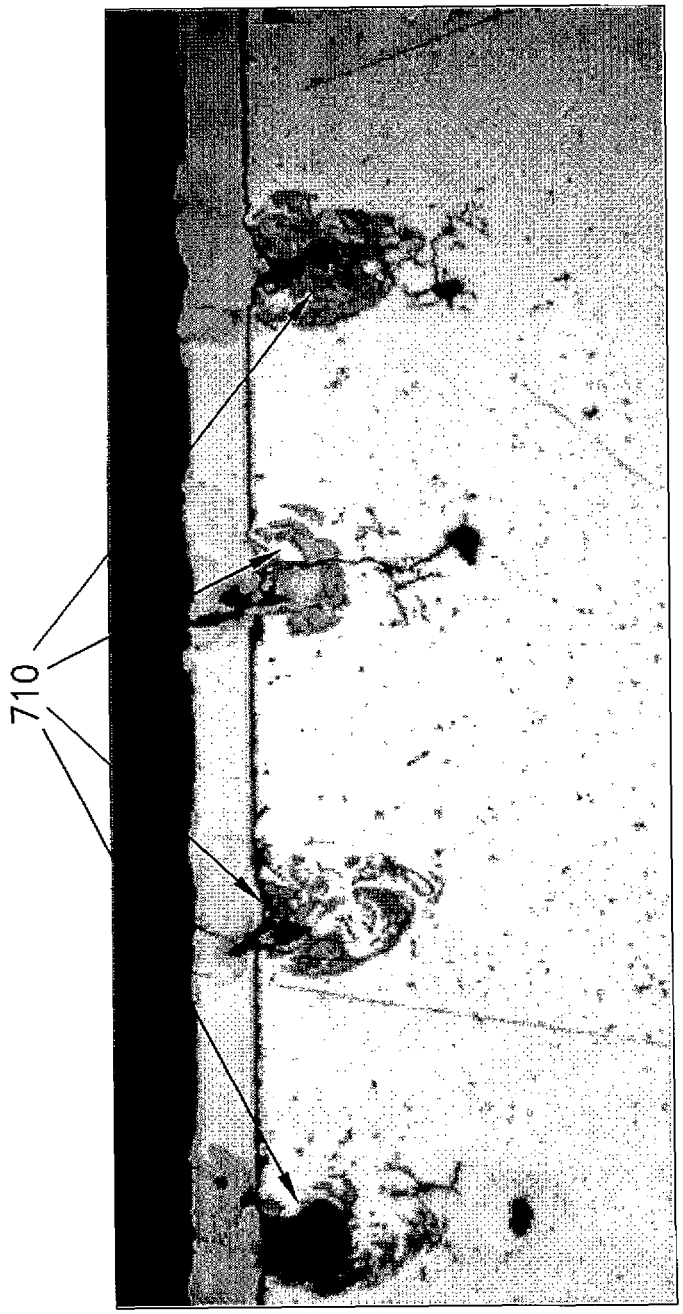

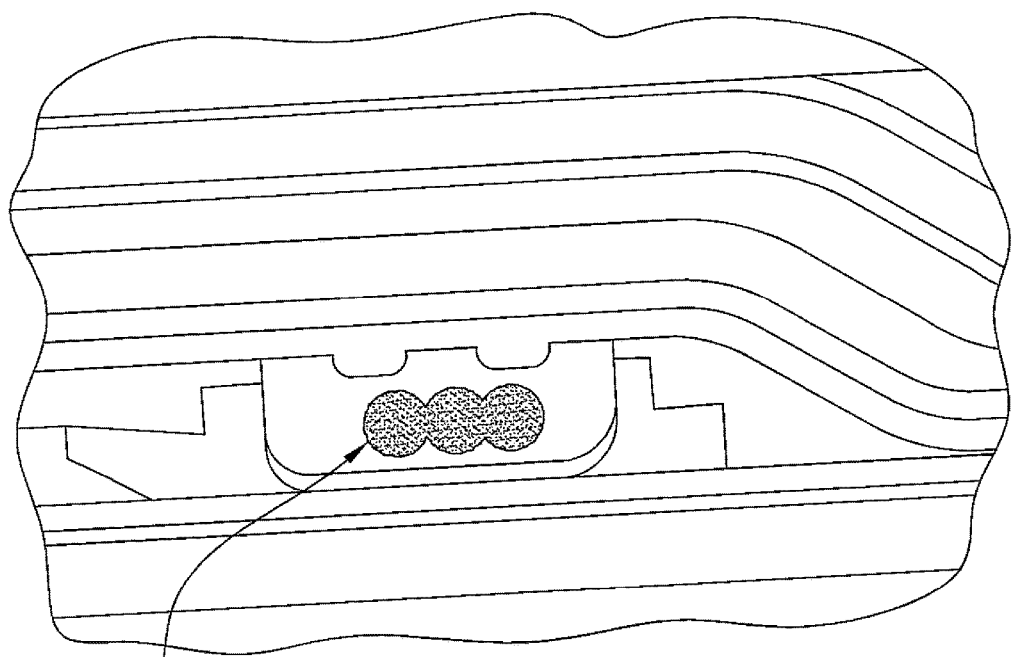
135      FIG.8
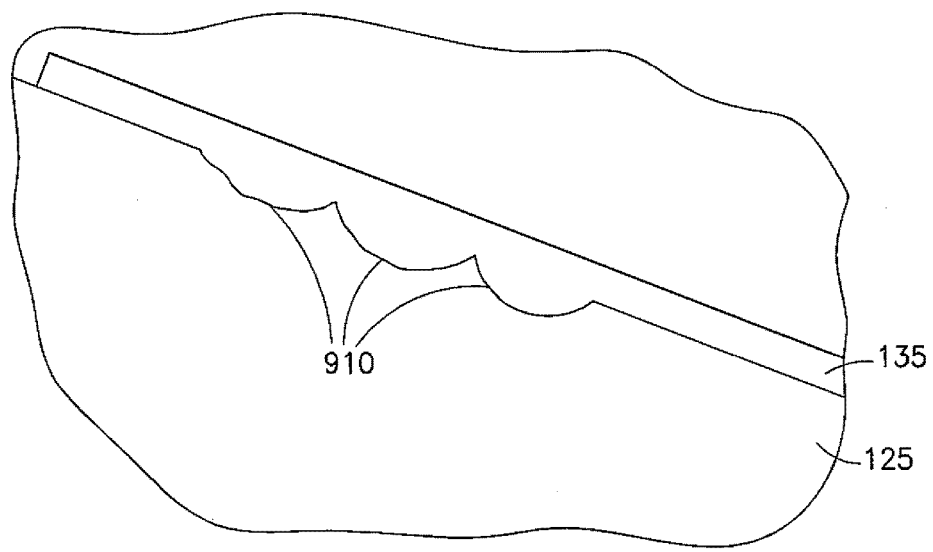
FIG.9

| | LEVEL | | | | |
|---|---|---|---|---|---|
| 1 MATERIAL | | −1 | 0 | 1 | |
| 2 PLATING | | −1 | 0 | 1 | |
| 3 SPOT SIZE | | −1 | | 1 | |
| 4 SURFACE FINISH | | −1 | | 1 | |
| 5 CURRENT | −2 | −1 | | 1 | 2 |
| 6 TIME | | −1 | 0 | 1 | |

| | OPTION 1 | OPTION 2 | OPTION 3 | OPTION 4 |
|---|---|---|---|---|
| MATERIAL | C5210 | C5191 | | |
| PLATING | GOLD | TIN | NICKEL | |
| SPOT SIZE/LENS | 80 | 120 | | |
| SURFACE FINISH | CNC | LASER ETCHED | | |
| CURRENT | 1 | 2 | 3 | 4 |
| TIME | 1 | 2 | 3 | |

FIG. 10

TRANSMISSION LINE STRUCTURE AND METHOD OF ATTACHING TRANSMISSION LINE STRUCTURE TO CONDUCTIVE BODY

CROSS REFERENCE

This application claims priority to U.S. Provisional Patent Application No. 61/883,567, filed Sep. 27, 2013, the contents of which are herein incorporated by reference in their entirety.

BACKGROUND

Technical Field

The exemplary and non-limiting embodiments disclosed herein relate generally to transmission line structures in electronic devices and, more particularly, to a planar transmission line structure in an electronic device, the planar transmission line structure being attached to a conductive chassis. The exemplary and non-limiting embodiments disclosed herein also relate to methods of attaching the transmission line structure to the conductive chassis.

Brief Description of Prior Developments

Handheld electronic devices such as mobile phones generally use coaxial cables as feed lines to conduct radio frequency signals to an antenna. Within such a device, the radio frequency signal feed is maintained via a metal-plated contact pad welded to a metal chassis and a spring contact separately mounted to a printed wire board. Such a configuration limits design options of the device. Furthermore, the reliability of the contact between the spring contact and the contact pad may be compromised due to use of the device in humid conditions or upon continued flexing of the spring contact.

SUMMARY

The following summary is merely intended to be exemplary. The summary is not intended to limit the scope of the claims.

In accordance with one aspect, a method comprises mounting a grounding clip to a planar flexible printed circuit transmission line; clamping the grounding clip to an inner wall of a chassis of an electronic device; and operating a laser beam to weld the grounding clip to the chassis to route the flexible printed circuit transmission line along the inner wall. Welding the grounding clip to the chassis causes the grounding clip to remain in contact with the planar flexible printed circuit transmission line to ground the planar flexible printed circuit transmission line to the chassis.

In accordance with another aspect, an apparatus comprises at least one processor and at least one memory including computer program code, the at least one memory and the computer program code configured to, with the at least one processor, cause the apparatus to: mount a grounding clip to a planar flexible printed circuit transmission line; clamp the grounding clip to a chassis of an electronic device; and operate a laser beam to weld the grounding clip to the chassis.

In accordance with another aspect, an apparatus comprises a conductive chassis; a planar flexible printed circuit transmission line on an internal surface of the conductive chassis; and one or more clips attached to the conductive chassis and in contact with the planar flexible printed circuit transmission line to ground the planar flexible printed circuit transmission line to the conductive chassis.

BRIEF DESCRIPTION OF THE DRAWINGS

The foregoing aspects and other features are explained in the following description, taken in connection with the accompanying drawings, wherein:

FIG. 7 is a photograph taken with a stereo microscope of heat damage, cracking, and gas inclusion defects in a process of welding a clip to a chassis;

FIG. 8 is a photograph of a clip welded to a chassis;

FIG. 9 is a photograph taken with a stereo microscope showing a proposed welding quality target;

FIG. 10 is a graphical illustration of a design of experiment setup for a process of attaching a planar flexible printed circuit transmission line to a metal chassis;

DETAILED DESCRIPTION OF EMBODIMENT

Fixed, portable, or handheld electronic devices that operate using radio frequency (RF) generally include housings in which electronic components are mounted on chassis fabricated of a conductive material such as metal or a material (e.g., polymer) containing a metal or other conductive material. In a handheld electronic device such as a mobile phone or notepad, the electronic components include one or more printed circuit boards (PCBs), a battery, and a display, all of which are stacked or otherwise arranged within an interior volume defined by the chassis. An RF feed is provided from an RF engine on the PCB to an associated antenna.

In the exemplary embodiments disclosed herein, the RF feed is from the RF engine to the antenna via one or more planar transmission structures (transmission lines) that include flexible printed circuits, the transmission lines being attached to conductive side walls of the chassis and being grounded to the chassis. The transmission lines attached to the conductive sides walls of the chassis are routed around an inner perimeter of the chassis, thereby saving space within the electronic device and facilitating the optimal placement of control and RF circuitry on the PCB. Attaching the transmission lines in this manner also simplifies the routing layout of the transmission lines, thus providing for effective RF radiation.

With a plurality of antennas in handheld electronic devices and with limited space within the housings of such devices, the transmission lines are grounded along the lengths thereof using surface mounted plated metal clips located at spacing's of some fraction of a wavelength of the transmission line. The metal clips provide for suitable grounding to the chassis via a mechanically-integrated elevated feed, thereby eliminating (or at least minimizing) contact resistance issues and reducing unwanted resonance that would otherwise inhibit performance of the antenna and degrade performance of the electronic device altogether. Although the features will be described with reference to the Figures below, it should be understood that features can be embodied in many alternate forms of embodiments. In addition, any suitable size, shape, or type of elements or materials could be used.

Figure 1:
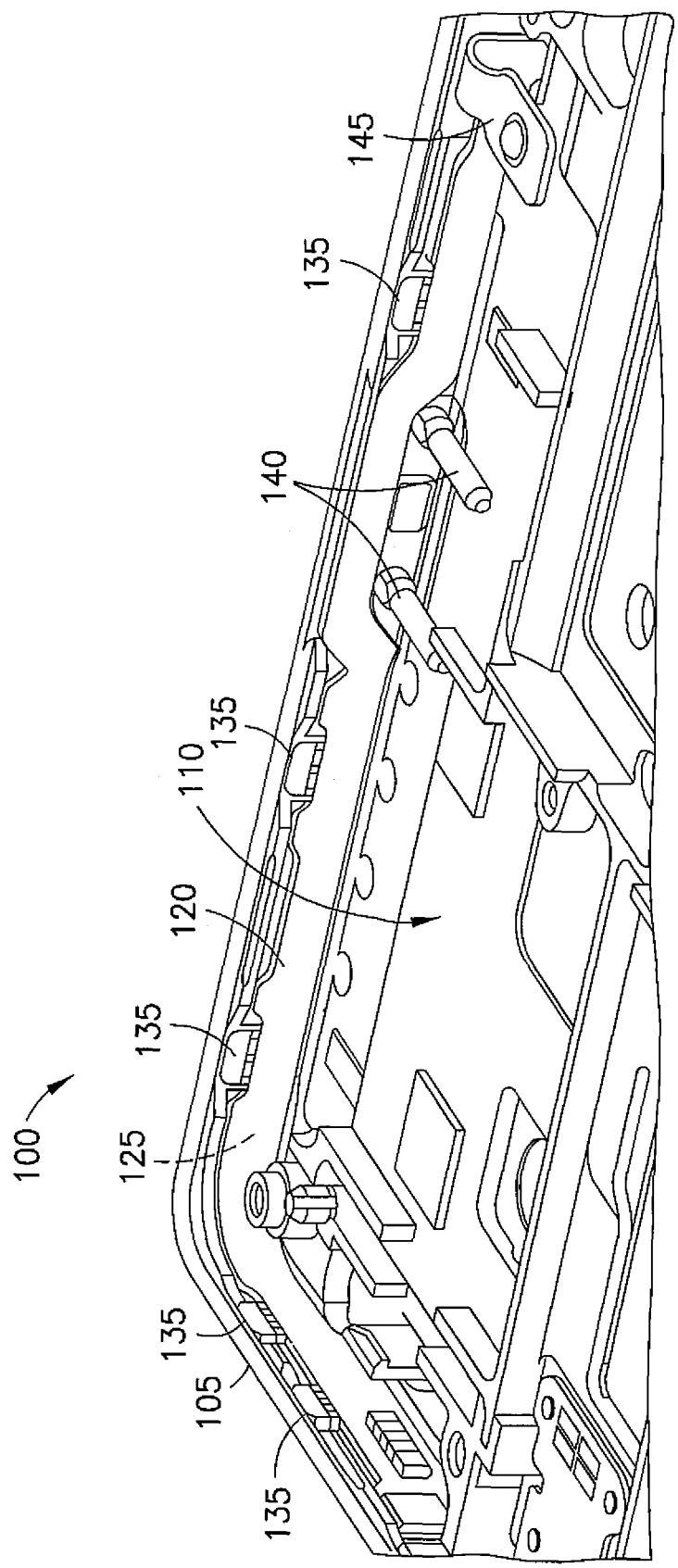
FIG. 1 is a perspective view of an interior portion of an electronic device showing a first planar flexible transmission line bonded to a chassis and grounded using mounting clips.
Figure 2:
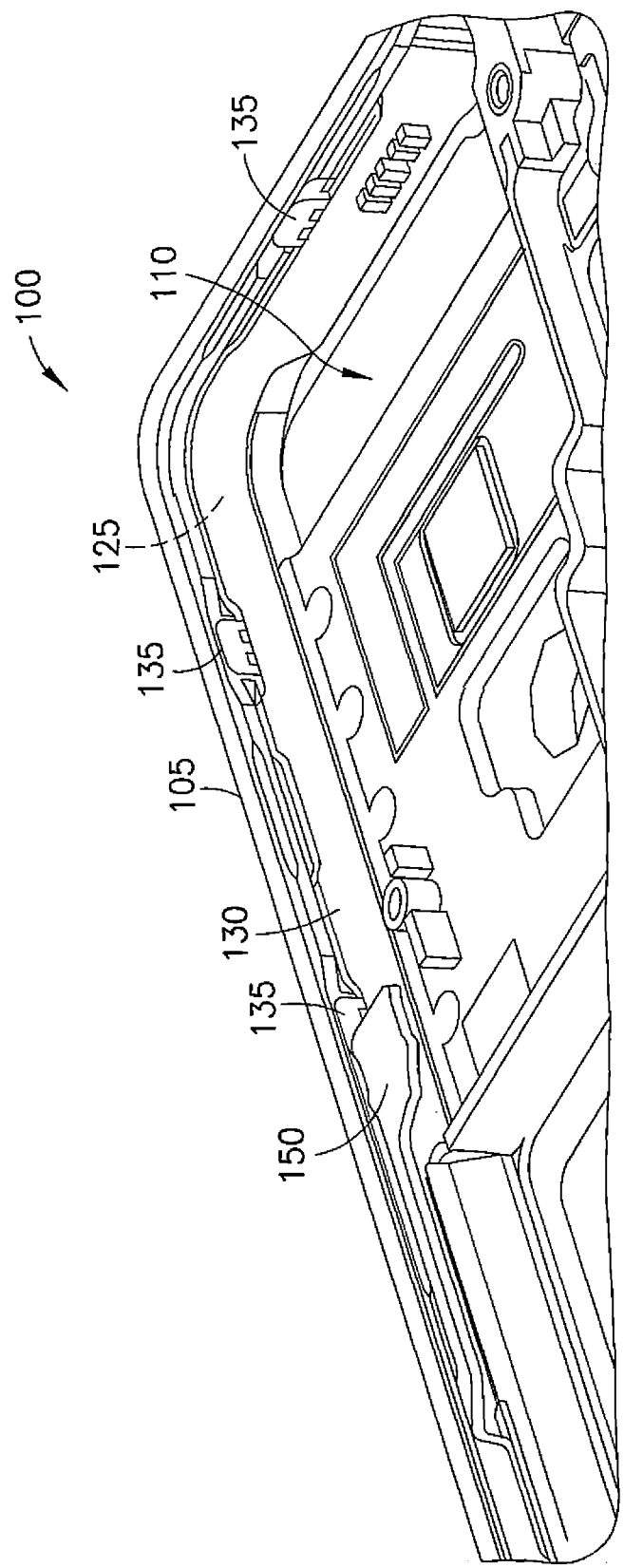
FIG. 2 is a perspective view of an interior portion of the electronic device of FIG. 1 showing a second planar flexible transmission line bonded to the chassis and grounded using mounting clips.

Referring to FIGS. 1 and 2, portions of an electronic device (e.g., a mobile phone) are designated generally by the reference number 100 and are hereinafter referred to as "device 100." Device 100, of which inner portions are shown, comprises a housing 105 in which a metal chassis 110 is mounted, one or more transmission lines 120, 130 are mounted to the chassis 110, and one or more antennas are in communication with the transmission lines 120, 130.

As shown in FIG. 1, the chassis 110 may be aluminum or aluminum alloy (e.g., 6061-T6 or the like). Sheet metal grounding clips (hereinafter "clips 135") are mounted to the chassis 110 along the transmission line 120 using a laser welding process. The clips 135 are phosphor bronze (copper-based) and plated (e.g., with a nickel plating or the like for stability in the laser welding process) to provide for suitable welding of the transmission line 120 to the chassis 110.

The transmission line 120 is a flexible printed circuit film bonded to an inner surface of a defining wall 125 of the chassis 110 or to a bezel. The transmission line 120 is substantially planar and is oriented to be substantially perpendicular to the stacked electronic components on a major plane of the chassis 110. Contours of the wall 125 may be incorporated into the transmission line 120 to accommodate various structures (e.g., audio jack ports 140 and the like) on or within the chassis 110. The transmission line 120 may extend through a radiused section of the wall 125 that corresponds to a rounded edge of an outer case of the device 100. A terminal portion 145 of the transmission line 120 is generally configured to engage an antenna. In the alternative, the transmission line 120 could be connected to the antenna using a spring connector. The transmission line 120 may be, for example, a data transmission line such as a Long Term Evolution (LTE) transmission line and is hereinafter referred to as "data transmission line 120."

As shown in FIG. 2, the other transmission line 130 is also a flexible printed circuit film bonded to the inner surface of the wall 125 of the chassis 110. As with the data transmission line 120, clips 135 are mounted to the chassis 110 along the transmission line 130 using the laser welding process to provide for grounding. Also as with the data transmission line 120, this transmission line 130 may include contours that allow it to correspond as desired to wall(s) of the chassis 110 and may include a terminal portion 150 configured to engage an antenna (or the transmission line 130 may be connected to the antenna using a spring connector). The transmission line 130 may be, for example, a voice transmission line and is hereinafter referred to as "voice transmission line 130."

Figure 3:
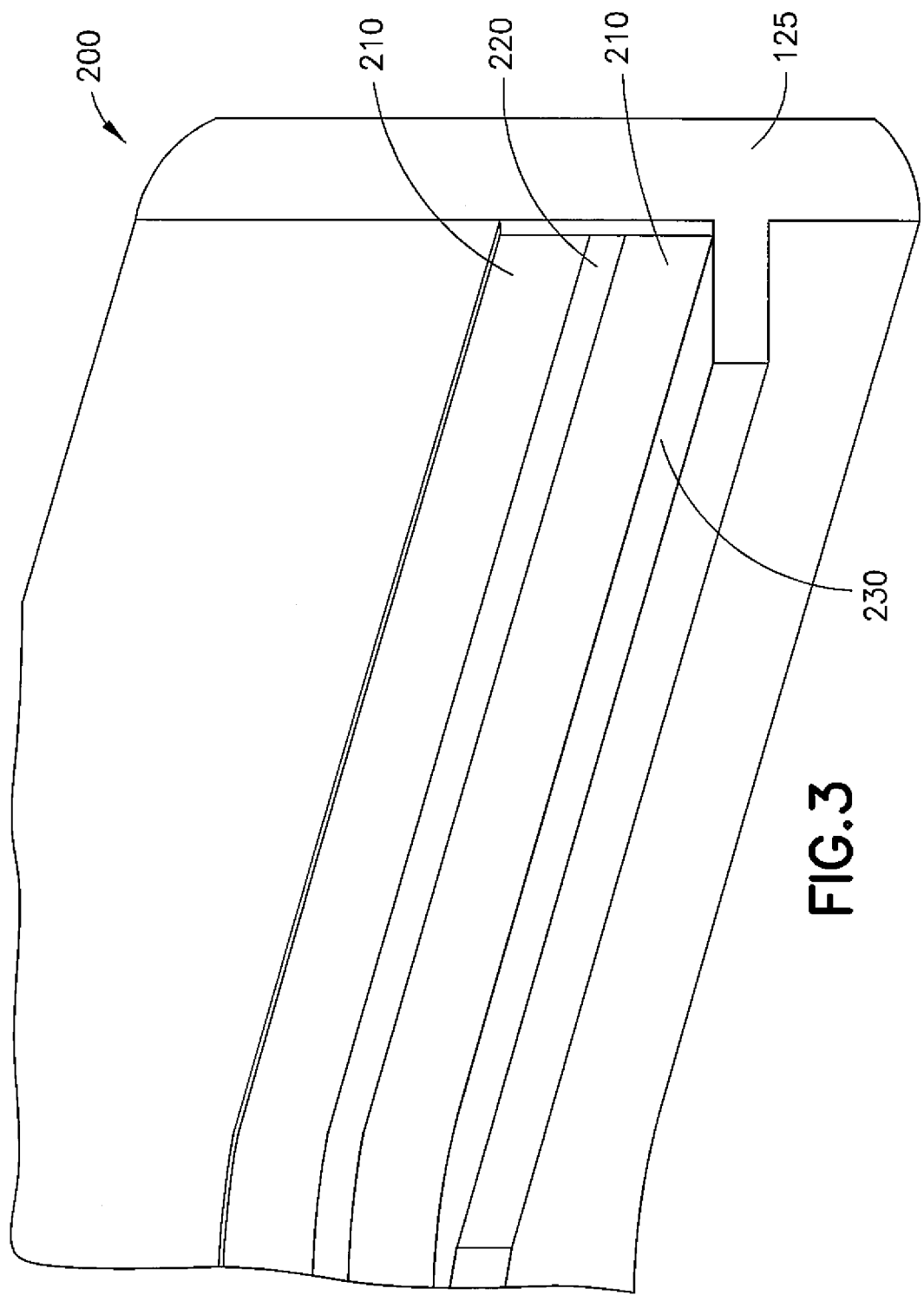
FIG. 3 is a perspective view of an elevated feed system implementing a flexible transmission line.
Figure 4:
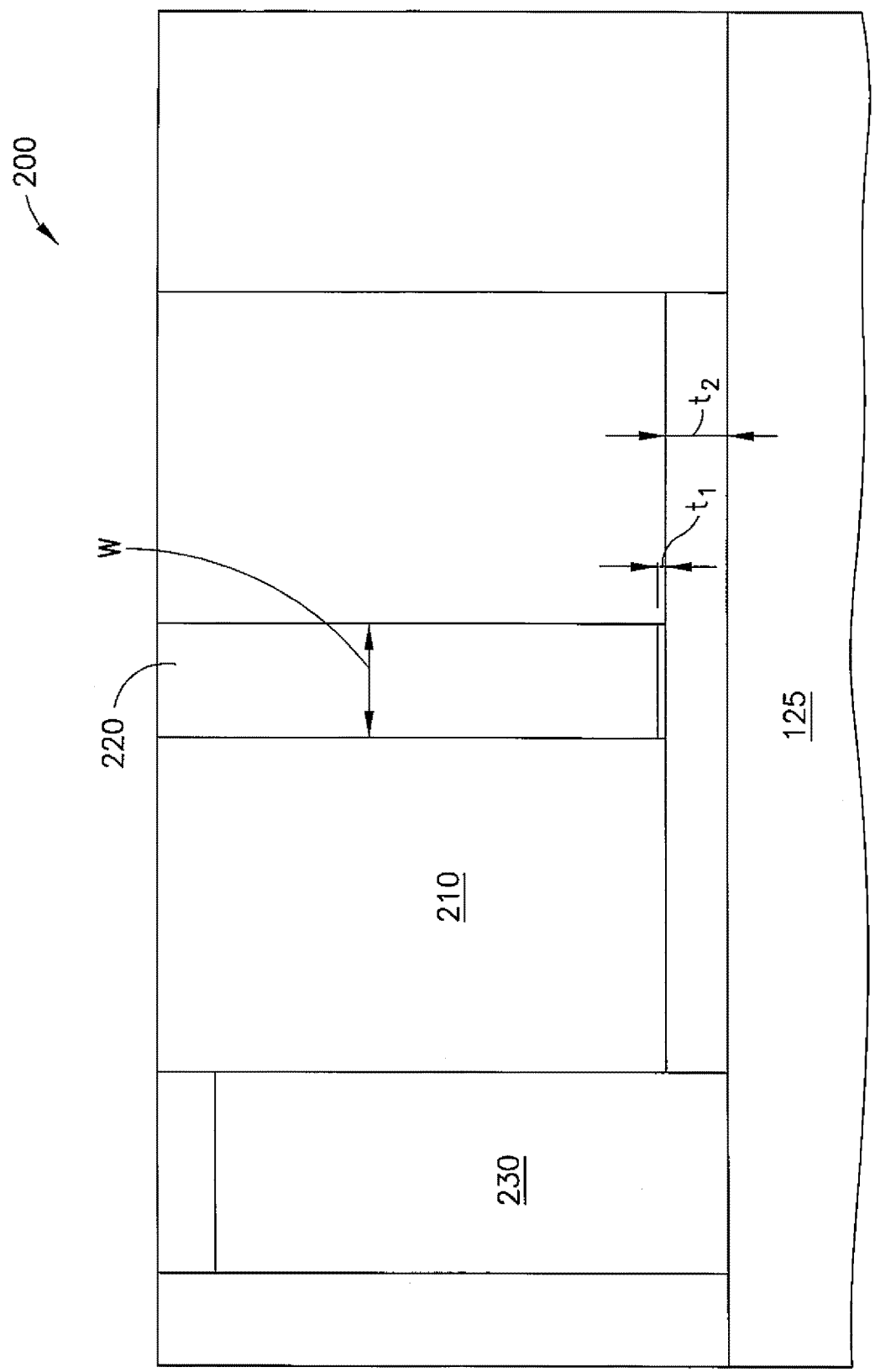
FIG. 4 is a schematic cutaway view of the elevated feed system of FIG. 3.

Referring now to FIGS. 3 and 4, one exemplary embodiment of an elevated feed system implementing a transmission line comprising a planar flexible printed circuit (e.g., both the data transmission line 120 and the voice transmission line 130) into a metal housing (e.g., the chassis 110) is designated generally by the reference number 200 and is hereinafter referred to as "elevated feed system 200." The elevated feed system 200 is an extension of a ground plane, the ground plane serving as a portion of the antenna to reflect RF signals. The elevated feed system 200 projects from the ground plane in a given direction, at the end of which projects the RF feed to the antenna. The transmission line provides RF signals to the end portion that extends the RF feed to the antenna. The transmission line is configured such that any leakage of RF waves from the transmission line is minimal (or zero). The exemplary embodiments described herein, however, are not limited to the use of elevated feed systems, as other configurations may be employed.

In the elevated feed system 200, the flexible printed circuits are of microstrip construction and comprise a flexible layer 210 mounted on a surface of the chassis 110 (e.g., the inner surface of the wall 125 of the chassis 110). A signal line 220 is located on the flexible layer 210. The microstrip construction is defined by attaching a unitary layer of flexible material (the flexible layer 210) directly to a metal surface of the chassis 110 along with the signal line 220 attached directly to the flexible layer 210. In some embodiments, the flexible layer 210 may be adhesively attached, as shown. A mechanical structure 230 (e.g., a lip) may be used as part of the elevated feed system 200. Surfaces of the mechanical structure 230 are flat and parallel with the signal line 220 surfaces in the proximity of the flexible layer 210.

The flexible layer 210 comprises a flexible dielectric material having a relative permittivity of about 3. Such dielectric materials include, but are not limited to, polytetrafluoroethylene, polyethylene, polypropylene, polystyrene, electroactive polymer material, liquid crystal polymer (LCP), and the like. The signal line 220 comprises gold, copper, silver, nickel, combinations of the foregoing materials, or the like. In one exemplary embodiment of the elevated feed system 200, a width W of the signal line 220 is about 290 micrometers (um), a thickness $t_1$ of the signal line 220 is about 20 um, and a thickness $t_2$ of the flexible layer 210 (with adhesive) is generally about 150 um (about 130 um to about 170 um). An impedance of the flexible layer 210 and the signal line 220 is about 50 ohms over the required band of radio frequencies for which the transmission line is designed for. When $t_2$ is as low as about 130 um, the impedance can be about 46 ohms, and when $t_2$ is as high as about 170 um, the impedance can be about 55 ohms.

Figure 5:
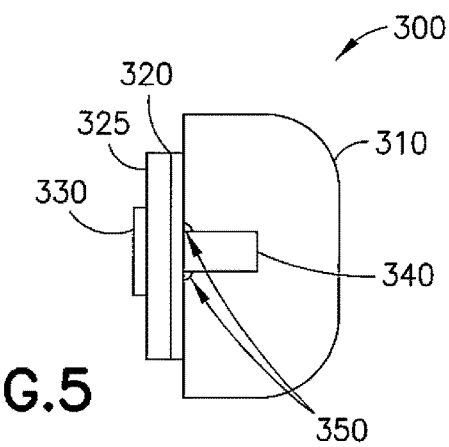
FIG. 5 is a side sectional view of an alternate embodiment of an elevated feed system.

Referring now to FIG. 5, an alternate embodiment of the elevated feed system is designated generally by the reference number 300 and is hereinafter referred to as "alternate elevated feed system 300." In the alternate elevated feed system 300, a transmission line comprising a planar flexible printed circuit film (e.g., the data transmission line 120 or the voice transmission line 130) can be incorporated into a bezel 310 or faceplate mounted around the display of the device 100. The transmission line in the alternate elevated feed system 300 comprises a ground strip 320 on which a dielectric layer 325 (which may be flexible) is attached. A signal line 330 is attached directly to the dielectric layer 325 to define a microstrip construction. The ground strip 320 is attached to a metal connector 340 that is received into the bezel 310.

The metal connector 340 has a cross sectional configuration that corresponds with a cross sectional configuration of a slot in the bezel 310. The cross sectional configurations of the metal connector 340 and the slot may be rectangular as shown, or they may be any other suitable configuration that facilitates the receiving of the metal connector 340 into the slot. The ground strip 320 may be attached to the metal connector 340 by a soldering or welding process by which fillets 350 are formed at the juncture of the ground strip 320 and the metal connector 340.

Figure 6:
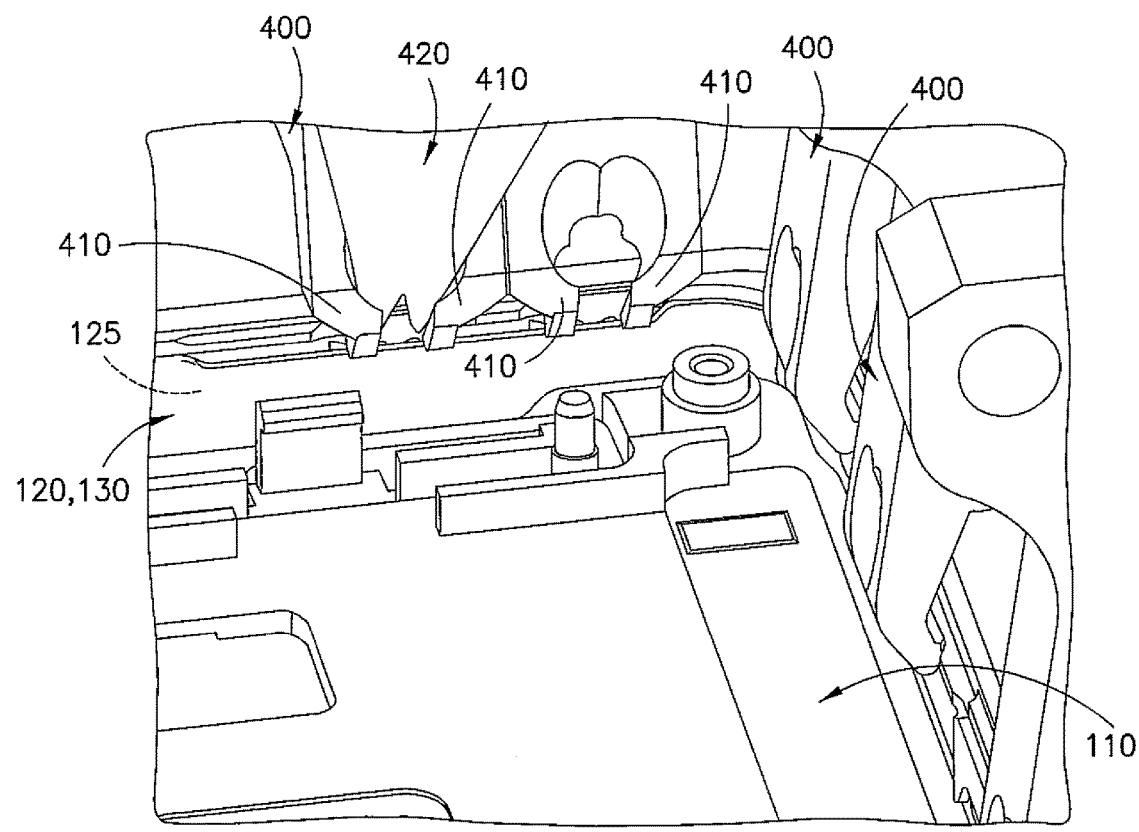
FIG. 6 is a perspective view of a process of clamping and welding clips to a chassis to ground a planar flexible transmission line.

Referring now to FIG. 6, both the data transmission line 120 and the voice transmission line 130 can be grounded to the inner surface(s) of the wall(s) using the clips 135. In one embodiment, the clips 135 are surface mounted on the films of the flexible printed circuits and soldered in place (e.g., using a pick and place machine or the like). The clips 135 are then welded to the wall(s) of the chassis 110 in a laser process to bond the transmission lines 120, 130 to the chassis 110. A pressing jig 400 is used to clamp the clips 135 to the wall 125 with portions of the transmission lines 120, 130 located between the clips 135 and the wall 125. The pressing jig 400 comprises two claws 410 spaced apart and configured to urge opposing ends of a clip 135 against a portion of the transmission line 120 (or transmission line 130) and the wall 125. A laser beam 420 is directed between the claws 410 to weld a portion of the clip 135 pressed against the wall 125 to the wall 125, thereby pinching the transmission line between the wall 125 and the clip 135. The exemplary embodiments as described herein are not so limited, however, as other means for ensuring intimate contact to carry out the welding process can be used. For example, magnets can be used to pull the clips against the chassis 110, or a flat plate with holes formed therein through which the laser beam 420 can be directed may be used. Using the laser beam 420 in any of the foregoing manners allows for suitable welding of copper-based clips 135 to an aluminum or aluminum-containing chassis 110.

Referring to FIG. 7, a photograph of a solution used in prior systems of welding clips to metal chassis shows damage points 710 resulting from heat, cracking of metal, and gas inclusion defects.

Referring now to FIGS. 8 and 9, a proposed quality target with regard to welding clips 135 to the wall 125 is shown. In FIG. 8, the clip 135 is gold plated. Preferably, the introduction of a nickel-plated clip would allow the process of welding to be more stable, thus allowing the welding quality target to be easier and more frequently reached. As shown in FIG. 9, target welding quality is reached by well-defined interfaces 910 between the material of the clip 135 and the wall 125. The well-defined interfaces 910 provide for suitable penetration of the weld with minimal or no heat damage.

Referring now to FIG. 10, a design of experiment (DOE) setup is shown generally at 1000 and is hereinafter referred to as "DOE setup 1000." In the DOE setup 1000, laser welding parameters for methods of welding clips 135 to the walls 125 are determined. Based on various levels 1010, options 1020 for selected parameters (e.g., material, plating composition, spot size/lens, surface finish, current, and time) are assessed, and an optimal configuration is determined. A preferred option 1020 is determined to include the phosphor bronze (e.g., hyper phosphor bronze (Cu-8Sn)) as the material, nickel for the plating composition, a spot size/lens of 120 millimeters (mm), a surface finish provided by computer numerical control (CNC), and an energy input of about 1.2 joules (J) (based on a selected time of 2 milliseconds (msec)).

Figure 11:
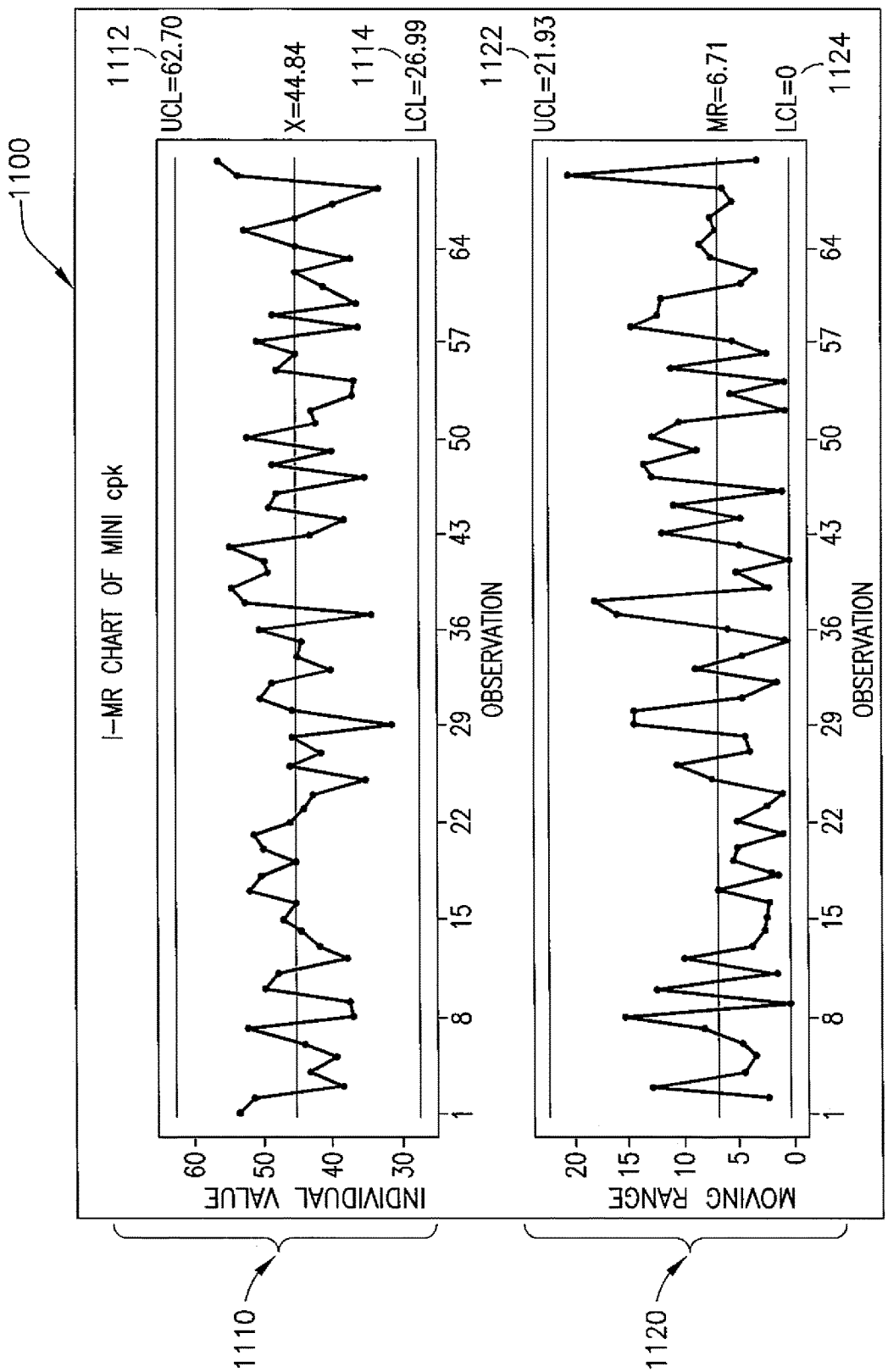
FIG. 11 is a graphical illustration of the results of the design of experiment setup of FIG. 10.

Referring now to FIG. 11, an individual and moving range (I-MR) chart of process capability is designated generally by the reference number 1100 and is hereinafter referred to as "chart 1100." Chart 1100 illustrates control of the process of welding the clips 135 and displays variations in the welding process. As can be seen, a mean value of the individual value 1110 is within an upper control limit 1112 and a lower control limit 1114. Additionally, a mean value of the moving range 1120 is substantially within an upper control limit 1122 and a lower control limit 1124.

Figure 12:
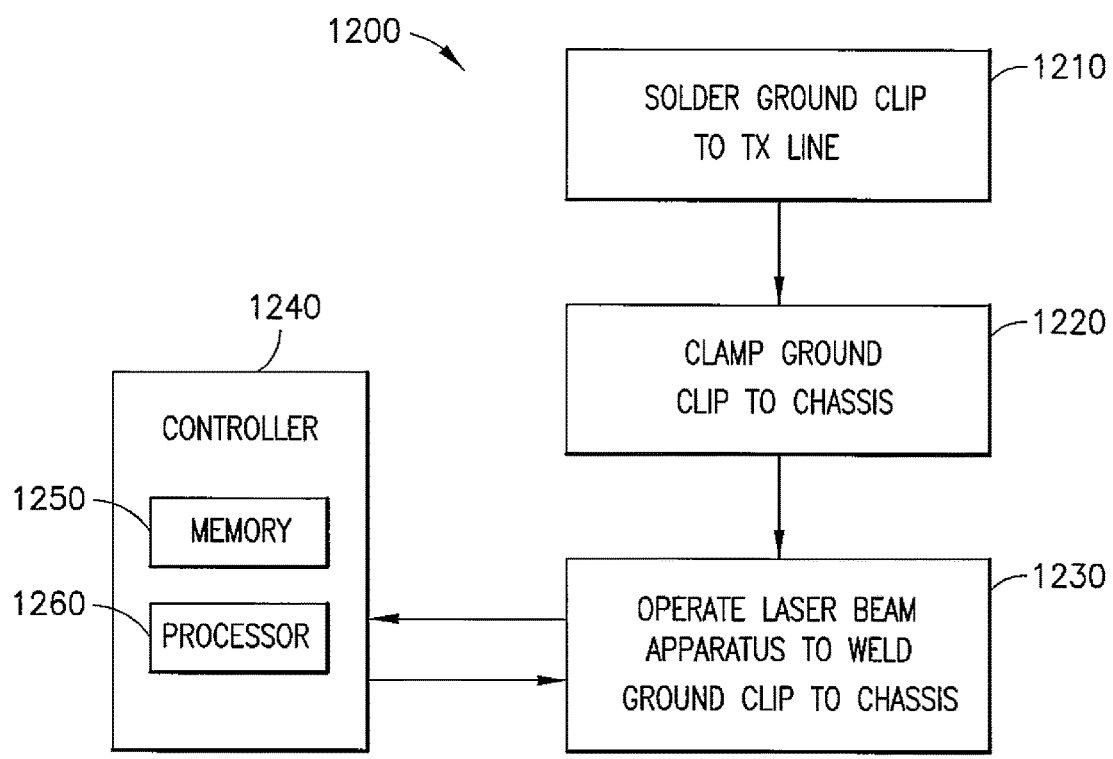
FIG. 12 is a flow illustrating a process of attaching a planar flexible transmission line to a chassis of an electronic device.

Referring now to FIG. 12, a flow illustrating one exemplary method of attaching and grounding a flexible printed circuit transmission line to a metal (or metal-containing) chassis is designated generally by the reference number 1200 and is hereinafter referred to as "method 1200." In method 1200, a grounding clip is surface mounted to a planar transmission line in a grounding clip attachment step 1210. The transmission line may be a flexible printed circuit transmission line as described herein. The grounding clip is attached to the transmission line, for example, using any suitable soldering process. In a clamping step 1220, the grounding clip is urged against the chassis using a pressing jig or the like to ensure intimate contact of the grounding clip to the chassis. A portion of the grounding clip is in contact with the transmission line. In a welding step 1230, a laser beam apparatus is operated to direct a laser beam at the grounding clip to weld the grounding clip to the chassis, thereby bonding the grounding clip to the chassis and causing the clip to remain in contact with the transmission line, thereby grounding the transmission line.

The operation of the laser beam apparatus may also be controlled via the controller 1240 having the memory 1250 and the processor 1260. This control may involve manipulation, of one or more of power to the laser apparatus, location of the application of the laser beam, and length of time of application of the laser beam.

A method comprises mounting a grounding clip to a planar flexible printed circuit transmission line; clamping the grounding clip to an inner wall of a chassis of an electronic device; and operating a laser beam to weld the grounding clip to the chassis to route the flexible printed circuit transmission line along the inner wall. Welding the grounding clip to the chassis causes the grounding clip to remain in contact with the planar flexible printed circuit transmission line to ground the planar flexible printed circuit transmission line to the chassis. Optionally, the planar flexible printed circuit transmission line may comprise adhesively attaching the planar flexible printed circuit transmission line to an inner wall of the chassis. Mounting a grounding clip to the planar flexible printed circuit transmission line may also comprise soldering the grounding clip to the planar flexible printed circuit transmission line. Clamping the grounding clip to the inner wall of the chassis comprises urging the grounding clip against the chassis using a pressing jig. Urging the grounding clip against the chassis using a pressing jig comprises causing two claws of the pressing jig to urge opposing ends of the grounding clip against the inner wall of the chassis. Operating a laser beam to attach the grounding clip to the chassis comprises directing the laser beam between two claws of a pressing jig clamping opposing ends of the grounding clip against the inner wall of the chassis. Operating a laser beam to weld the ground clip to the chassis is controlled using a controller having a memory and a processor. Control of the operating a laser beam to weld the ground clip to the chassis comprises controlling one or more of power to the laser apparatus, location of the application of the laser beam, and length of time of application of the laser beam.

An apparatus comprises at least one processor and at least one memory including computer program code, the at least one memory and the computer program code configured to, with the at least one processor, cause the apparatus to: mount a grounding clip to a planar flexible printed circuit transmission line; clamp the grounding clip to a chassis of an electronic device; and operate a laser beam to weld the grounding clip to the chassis. Welding the grounding clip to the chassis causes the grounding clip to remain in contact with the planar flexible printed circuit transmission line, and the grounding clip grounds the planar flexible printed circuit transmission line to the chassis. The apparatus is caused to clamp the grounding clip to the chassis using a pressing jig.

An apparatus comprises a conductive chassis; a planar flexible printed circuit transmission line on an internal surface of the conductive chassis; and one or more clips attached to the conductive chassis and in contact with the planar flexible printed circuit transmission line to ground the planar flexible printed circuit transmission line to the conductive chassis. An adhesive may be included between the planar flexible printed circuit transmission line and the conductive chassis. The planar flexible printed circuit transmission line may comprise an elevated feed system defined by a flexible layer bonded to the conductive chassis and a signal line attached to the flexible layer. A soldered or welded connection may be included between the planar flexible printed circuit transmission line and the conductive chassis. The planar flexible printed circuit transmission line comprises an elevated feed system defined by a metal connector received into a slot in a bezel of the apparatus, a ground strip attached to the metal connector by soldered or welded fillets formed at a juncture of the ground strip and the metal connector, a dielectric layer attached to the ground strip, and a signal line attached to the dielectric layer. The planar flexible printed circuit transmission line is mounted perpendicular to a major plane of the conductive chassis. The one or more clips comprise nickel plated phosphor bronze. The conductive chassis comprises aluminum or 6061-T6 aluminum alloy. The one or more clips are attached to the conductive chassis using a laser welding means.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus, comprising at least one processor, and at least one memory including computer program code, the at least one memory and the computer program code configured to, with the at least one processor, cause the apparatus to: mount a grounding clip to a planar flexible printed circuit transmission line; clamp the grounding clip to a chassis of an electronic device; and laser weld the grounding clip to the chassis; wherein laser welding the grounding clip to the chassis causes the grounding clip to remain in contact with the planar flexible printed circuit transmission line, and wherein the grounding clip grounds the planar flexible printed circuit transmission line to the chassis, and wherein the planar flexible printed circuit transmission line comprises an elevated feed system defined by a flexible layer bonded to the chassis and a signal line attached to the flexible layer.

2. The apparatus of claim 1, wherein the apparatus is caused to clamp the grounding clip to a chassis of an electronic device using a pressing jig.

3. An apparatus, comprising: a conductive chassis; a planar flexible printed circuit transmission line on an internal surface of the conductive chassis; and one or more clips attached to the conductive chassis and in contact with the planar flexible printed circuit transmission line to ground the planar flexible printed circuit transmission line to the conductive chassis; wherein the planar flexible printed circuit transmission line comprises an elevated feed system defined by a flexible layer bonded to the conductive chassis and a signal line attached to the flexible layer.

4. The apparatus of claim 3, further comprising an adhesive between the planar flexible printed circuit transmission line and the conductive chassis.

5. The apparatus of claim 3, further comprising a soldered or welded connection between the planar flexible printed circuit transmission line and the conductive chassis.

6. The apparatus of claim 5, wherein the planar flexible printed circuit transmission line comprises an elevated feed system defined by a metal connector received into a slot in a bezel of the apparatus, a ground strip attached to the metal connector by soldered or welded fillets formed at a juncture of the ground strip and the metal connector, a dielectric layer attached to the ground strip, and a signal line attached to the dielectric layer.

7. The apparatus of claim 3, wherein the planar flexible printed circuit transmission line is mounted perpendicular to a major plane of the conductive chassis.

8. The apparatus of claim 3, wherein the one or more clips comprise nickel plated phosphor bronze.

9. The apparatus of claim 3, wherein the conductive chassis comprises aluminum or 6061-T6 aluminum alloy.

10. The apparatus of claim 3, wherein the flexible printed circuit transmission line comprises a flexible dielectric layer.

11. The apparatus of claim 3, wherein the one or more clips are attached to the conductive chassis using a laser welding means.

* * * * *